United States Patent
Degerstrom et al.

(10) Patent No.: US 7,348,597 B1
(45) Date of Patent: Mar. 25, 2008

(54) APPARATUS FOR PERFORMING HIGH FREQUENCY ELECTRONIC PACKAGE TESTING

(75) Inventors: Michael J. Degerstrom, Rochester, MN (US); Matthew L. Bibee, Bloomington, MN (US); Daniel V. Hulse, Prior Lake, MN (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 11/079,604

(22) Filed: Mar. 14, 2005

(51) Int. Cl.
*H01L 23/58* (2006.01)

(52) U.S. Cl. .................. 257/48; 257/693; 257/698; 257/728; 257/E23.179; 438/14; 438/15; 438/18; 324/765

(58) Field of Classification Search .................. 257/48, 257/693, 698, 728, E23.179; 324/763–765, 324/754, 757, 758, 751, 755, 752; 438/15, 438/14, 1, 18
See application file for complete search history.

(56) References Cited

U.S. PATENT DOCUMENTS

| | | | | |
|---|---|---|---|---|
| 5,142,224 A | * | 8/1992 | Smith et al. ................ | 324/765 |
| 5,351,001 A | * | 9/1994 | Kornrumpf et al. ..... | 324/158.1 |
| 5,614,442 A | * | 3/1997 | Tserng .................... | 438/122 |
| 5,942,911 A | * | 8/1999 | Motika et al. ............. | 324/769 |
| 6,215,377 B1 | * | 4/2001 | Douriet ..................... | 333/247 |
| 2005/0216213 A1 | * | 9/2005 | Sternberg et al. ........... | 702/69 |

\* cited by examiner

*Primary Examiner*—Minhloan Tran
*Assistant Examiner*—Banjamin Tzu-Hung Liu
(74) *Attorney, Agent, or Firm*—LeRoy D. Maunu

(57) ABSTRACT

Various apparatus for performing high frequency electronic package testing are disclosed. A test fixture assembly includes an electronics package having an interface structure, a mock-up IC, coupled to the interface structure for providing circuit connections, and a fixture board, coupled to the interface structure, wherein at least one of the fixture board and mock-up IC includes high frequency probe pads for providing a signal and ground point for high bandwidth test probing. Raw measurements are used for validation of the electronic package specifications when adequate test fixture bandwidth is available or included into circuit simulations models when a minimal phase error is acceptable, else phase and loss corrections are applied to the measurements.

13 Claims, 4 Drawing Sheets

APPARATUS FOR PERFORMING HIGH FREQUENCY ELECTRONIC PACKAGE TESTING

FIELD OF THE INVENTION

This disclosure relates in general to testing of electronic devices, and more particularly to an apparatus for performing high frequency electronic package testing.

BACKGROUND

The semiconductor industry has seen a major shift from leads to balls and from wires to bumps. This requires infrastructure developments and promises new opportunities. Ball grid array (BGA) packages are increasingly found in products including personal computers, portable communications devices, workstations/servers, mid-range and high-end computers, network and telecommunications systems, and even automotive applications. More specifically, BGA packages are being used in high speed circuits such as processors, application specific integrated circuits (ASICs), storage controllers, video controllers, programmable logic devices (PLDs), field programmable gate array (FPGA), etc.

Today's BGA packages boast high clock speeds, fine pitch structures and high pin-counts. When these packages are assembled onto a PC board, they perform predetermined functions at certain speeds. BGA packages continue to evolve toward smaller overall package dimensions that have an increased number of leads. Moreover, system designers require these devices be capable of operating at high frequencies. Such devices may include a complex array of closely spaced electrical leads adapted for establishing electrical communication with a semiconductor die, each lead having one end electrically connected to the semiconductor die. An opposing end is generally adapted for electrical connection to an external device, e.g., a printed circuit board. A conventional BGA package includes a semiconductor die secured to a die-attach pad formed on an upper surface of a substrate. The BGA package also includes a plurality of electrical leads adapted to provide electrical communication between the semiconductor die and one or more external devices. The semiconductor die and at least a portion of each electrical lead may be encased by an encapsulant material or, alternatively, the conventional BGA package may have no encapsulant material, depending upon the particular package construction and intended use.

In BGA packages, each of the electrical leads includes an external ball lead configured for electrical connection to an external device. The ball lead may be secured to a conductive pad formed on a lower surface of the substrate. Typically, each electrical lead further comprises a conductive via extending from the conductive pad and through the substrate to a conductive trace. The conductive trace is formed on either the upper or lower surface of the substrate or can be formed on inner layers of the substrate. The conventional BGA package may include a plurality of the ball leads arranged, for example, in an array or arrays of mutually adjacent rows and columns. The arrangement of ball leads is typically referred to as the "pin-out" or the "footprint" of the BGA package.

Electrical modeling of the package structures is often used to ensure adequate electrical performance. In addition to modeling the electrical behavior of a device, it is often desirable to directly measure certain electrical characteristics using measuring instruments in order to validate the electrical model. The demand for higher performance digital (and analog) systems ultimately requires higher bandwidth components. Moreover, one of the most common components used in modern digital and mixed signal systems is the ball-grid-array (BGA) package. The BGA protects the integrated circuit (IC), offers a low thermal path between the IC and the ambient environment, and provides electrical connection from the densely spaced IC pads to the less densely spaced solder balls. The design of the BGA electrical connections is critical to meeting the high frequency requirements. Therefore it is important to accurately test these electrical connections.

The main obstacle with producing high accuracy tests is the lack of a very high bandwidth interface between the test equipment and BGA package. High accuracy tests usually require a signal and ground point at both the solderball and IC connection sides. Furthermore, most high frequency paths are differential meaning that every signal is comprised of a pair (true and complement) of connections.

Published techniques usually entail the use of a fixture board to which the BGA is soldered. Then high frequency paths are routed a short distance on the fixture board to enable probing with readily available medium-pitch microwave probes. Or, alternatively, vias are used on the fixture board and direct probe contacts are made to the backside of the fixture board. Connections between the test equipment to the IC connections on the package are much more difficult. Either they are not done at all or depend on direct probing with readily available fine-pitch microwave probes. Providing that the locations of ground and signals are compatible with the fixed position probe tips, this technique is possible, but the quality of the probe connection is usually poor.

It can be seen then that there is a need for an apparatus for performing high frequency electronic package testing.

SUMMARY OF THE INVENTION

To overcome the limitations described above, and to overcome other limitations that will become apparent upon reading and understanding the present specification, the present invention discloses an apparatus for performing high frequency electronic package testing.

The present invention solves the above-described problems by providing a test methodology that enables electronic packaging having an interface structure to be accurately tested at very high frequencies. The test methodology employs the use of relatively inexpensive test fixtures and subsequent assembly procedures. The accurate measurements obtained using this methodology yield performance criteria that serve as a tool to the design engineer and as a marketing tool to potential customers.

An embodiment of the present invention includes an electronic package having an interface structure, a mock-up integrated circuit (IC) coupled to the interface structure, for providing circuit connections and a fixture board, coupled to the interface structure, wherein at least one of the fixture board and mock-up IC includes high frequency probe pads for providing a signal and ground point for high bandwidth test probing. The mock-up IC in one embodiment of the present invention includes a puck. Raw measurements, after being corrected for fixturing phase and amplitude errors, can be used for validation of specifications and can be included into circuit simulation models.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION

In the following description of the embodiments, reference is made to the accompanying drawings that form a part hereof, and in which is shown by way of illustration the specific embodiments in which the invention may be practiced. It is to be understood that other embodiments may be utilized because structural changes may be made without departing from the scope of the present invention.

An apparatus of an embodiment of the present invention provides for performing high frequency electronic package testing. The embodiment enables electronic packages having an interface structure to be accurately tested at very high frequencies.

Figure 1:
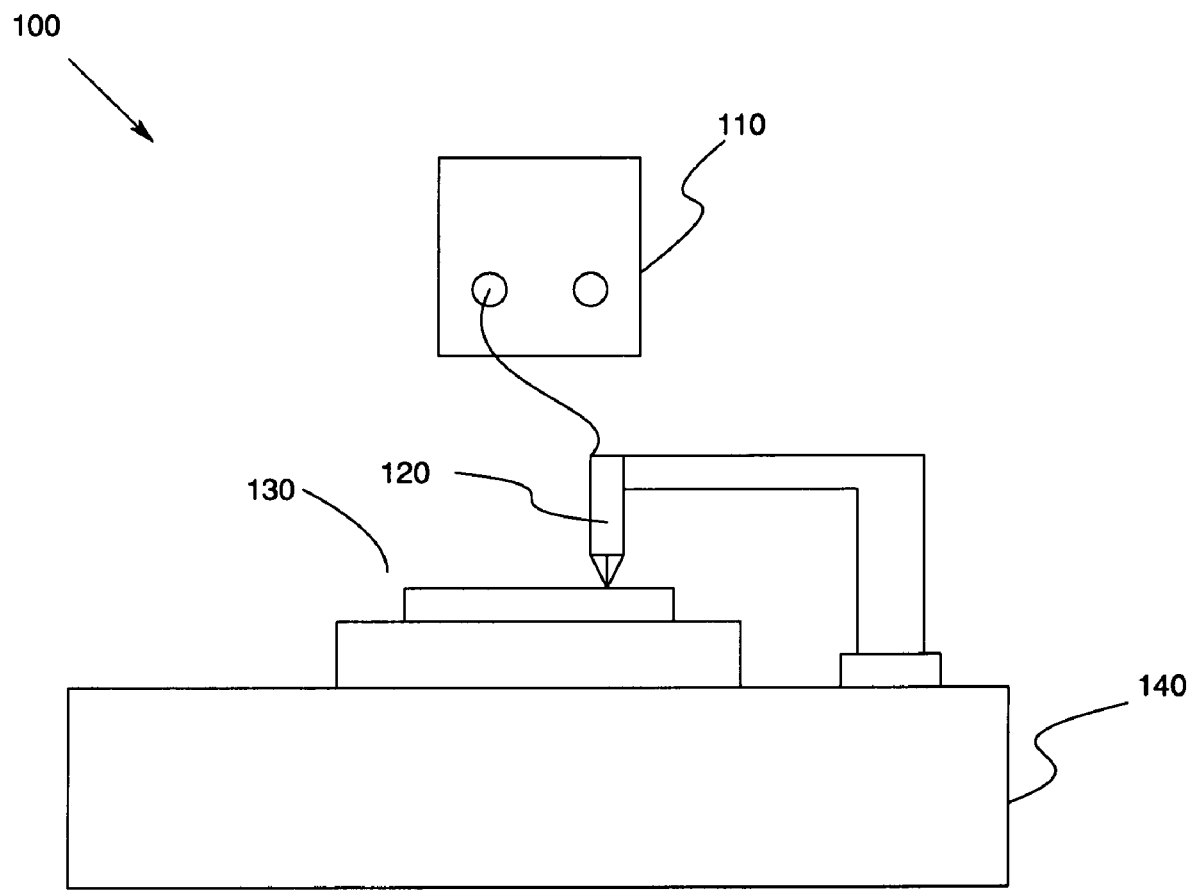
FIG. 1 illustrates a test system that may be used to perform high frequency electronic package testing of a ball grid array according to an embodiment of the present invention.

FIG. 1 illustrates a test system 100 that may be used to perform high frequency electronic package testing of electronic devices according to an embodiment of the present invention. The test system 100 includes a network analyzer 110 that may be electrically connected to a coaxial test probe 120. The coaxial test probe 120 is configured to establish electrical contact with one or more electrical leads of a device under test (DUT) 130. Also, the coaxial test probe 120 may form a part of, or be supported in, a probe station 140, the probe station 140 being configured to provide accurate positioning of the coaxial test probe 120 relative to the DUT 130. The test system 100 may be used, in conjunction with novel test fixturing and test methods according to embodiments of the present invention as will now be described in greater detail.

The technologies covered by "electronic packaging" are evolving rapidly. Research into electronic packaging continues to evolve as a tool for improving device performance, functionality, and reliability. Thus, it is to be understood that the present invention is applicable for use with different types of interface structures including wire bonded fixture assemblies, flip-chip fixture assemblies, etc. and other electronic circuit technology which may become available as electronic packaging technology develops in the future. However, for the sake of simplicity, discussions will concentrate mainly on wire bonded fixture assembly and flip-chip fixture assembly examples of electronic packaging, although the present invention is not limited thereto.

Figure 2A:
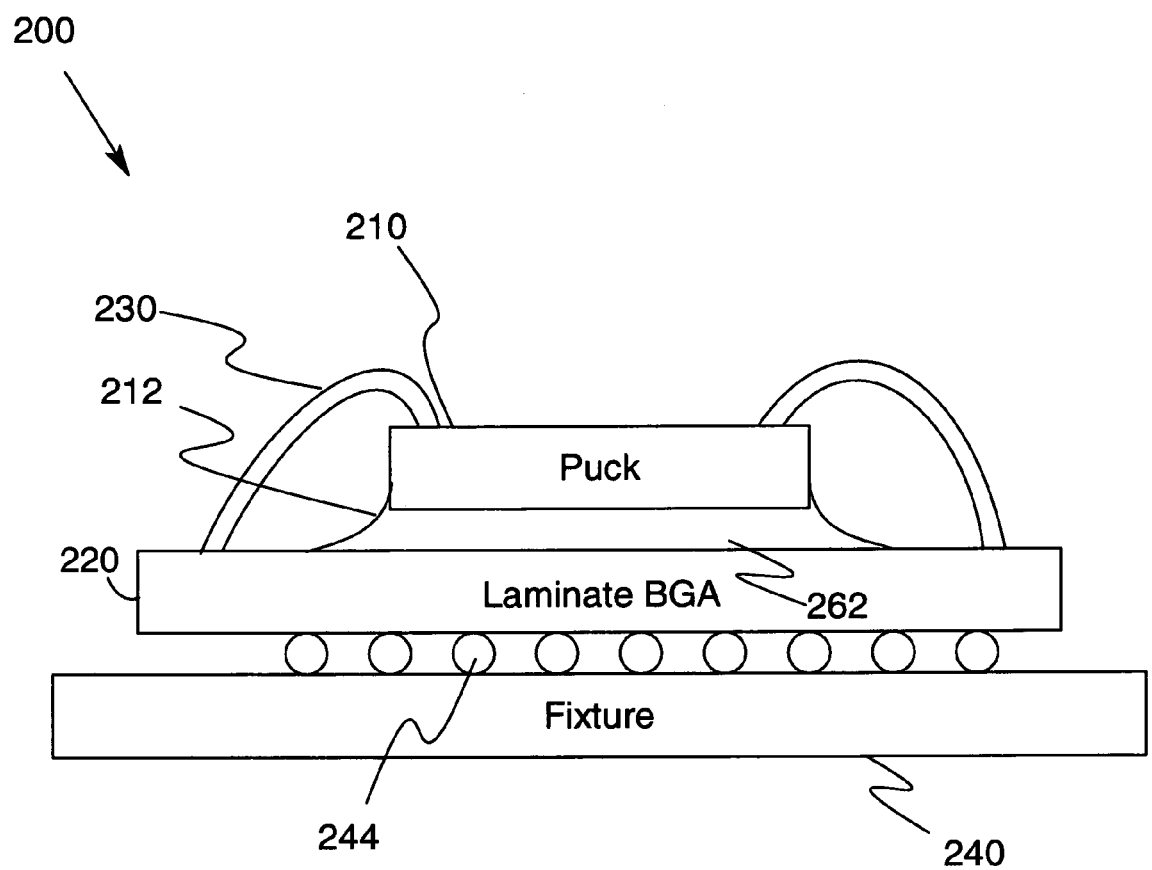
FIG. 2a is a side view of a wire bonded fixture assembly for performing high frequency electronic package testing according to an embodiment of the present invention.
Figure 2B:
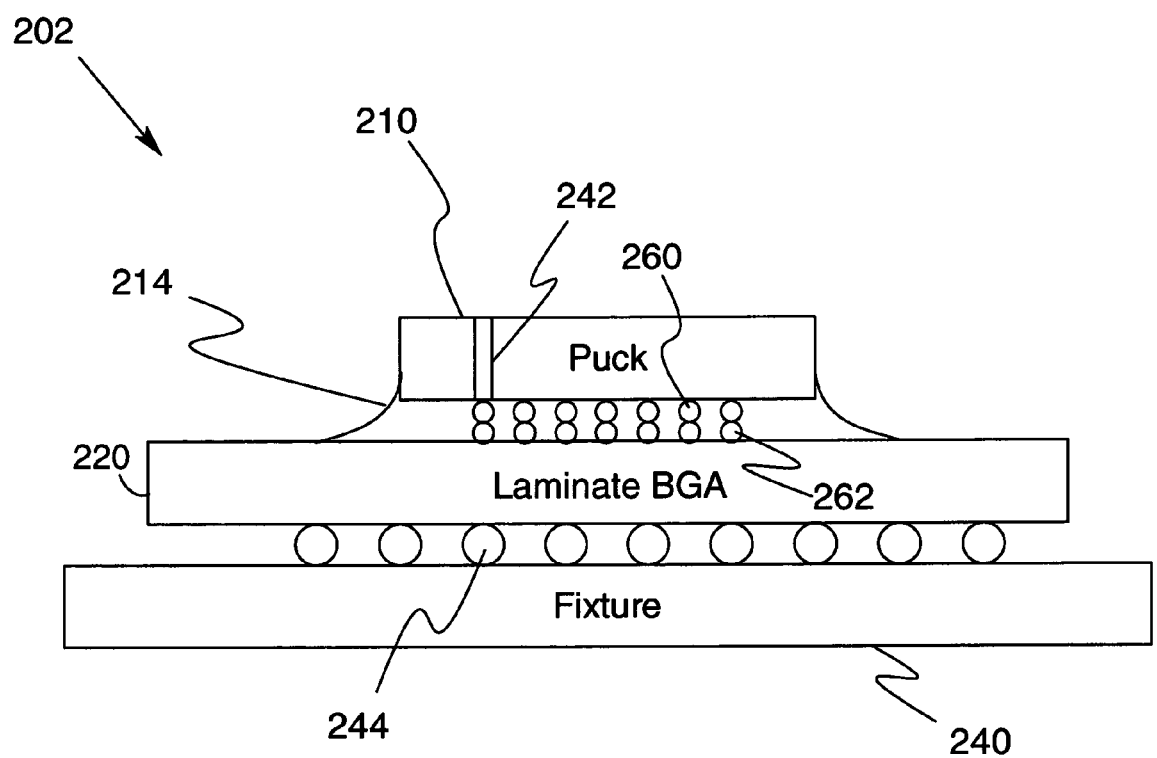
FIG. 2b is a side view of a flip-chip fixture assembly for performing high frequency electronic package testing according to an embodiment of the present invention.

FIG. 2a is a side view of a wire bonded fixture assembly 200 for performing high frequency electronic package testing according to an embodiment of the present invention. FIG. 2b is a side view of a flip-chip fixture assembly 202 for performing high frequency electronic package testing according to another embodiment of the present invention. There is just one active face on the puck 210. If wirebonds 230 as shown in FIG. 2a are used, then the active side is up. If bumps 260 are used as shown in FIG. 2b, then the active side is face down. However, the present invention is not meant to be limited to use with just these types of interface structures.

Referring to both FIGS. 2a and 2b, the fixture assemblies 200, 202 includes two parts: one for interfacing with the IC connections and another to interface with the electronics package having an interface structure. Here the interface structure includes solderball connections of the BGA package. A puck 210 is disposed over an organic (laminate) BGA 220. The puck 210 is then bonded onto the BGA 220. The BGA 220 is in turn solder assembled onto the fixture board 240. The fixture 240 and puck 210 may be fabricated with thin film technology, which allows for fine metal widths and narrow spacings between metal features. The fixture 240 is slightly larger than the BGA 220. The puck 210 serves the purpose of a surrogate IC. The puck 210 may be configured to emulate a wirebonded IC or a flip-chip IC. The puck 210 is one example of a mock-up IC, which is an IC, which has some, but not necessarily all the structures, and properties of the actual wirebonded IC or the flip-chip IC. The mock-up IC has at least those structures and properties needed to test the IC. In an alternative embodiment the mock-up IC could be the actual wirebonded IC or the flip-chip IC.

In FIG. 2a, the wirebond puck 210 is designed to be the same thickness and size as the IC. Epoxy 212 is used to bond the puck to the laminate BGA 220. The material between the puck 210 and laminate 220 is intended to be an attachment material, such as epoxy, which ideally would be the same thickness as that material used to attach the actual IC to the laminate 220. High frequency probe pads 250 (not shown) are formed on the puck 210 and the fixture 240. The puck 210 is attached to the BGA to match the same location as the IC and wirebonds 230 are applied between the puck 210 and BGA 220. For the wirebonded package, the exact configuration of the wirebonds 230 used with the IC may be used. Therefore, the tested assembly reconstructs the actual assembly to ensure that testing accurately reflects the true performance of the final product.

In FIG. 2b, a very thin substrate is used with metalization on the top and bottom on the puck 210 that is interconnected with vias 242. For the flip-chip fixture 202 shown in FIG. 2b, epoxy 212 is not used. Solder bumps 260 are soldered to mating pads 262 on the top surface of BGA 220. The vias 242 in the puck 210 align with the signal and ground solder bumps 260 to bring signal and ground to the top surface of the puck 210 where these vias 242 are then routed with metal to redistribute the signals and grounds to match the probe patterns for the fine-pitch microwave probes. The puck 210 is designed with metal that is compatible with the flip-chip attach process which is used for assembling the puck 210 to the BGA 220.

In FIG. 2b, only one via in the puck is shown, but those skilled in the art will recognize that in practice many such vias 242 may be provided. The vias 242 allow electrical connection to the top of the fixture 240 where probe pads are patterned for the microwave probes. The bumps 260 can generally support the puck 210 above the laminate 220, but the material 214 shown between the puck 210 and laminate 220, i.e., flowing around the bumps, can provide additional support and/or replicate the material, and thus electrical properties that would be used in the actual IC attach. In the actual IC attach, these materials 214 are often used, e.g., underflow materials such as special purpose epoxy, to keep the solder bumps 260 from cracking during thermal cycles caused by power-up and power-down sequencing. Since the assembly 202 will be kept at room temperature, then adding the underfill better replicates the electrical properties of the bump attach region.

Alternately, the flip-chip puck may include resistor-terminations, wherein the signals and grounds are not brought from the bottom to the top of the puck 210. Instead the signal connections on the bottom of the puck 210 are simply terminated with 50 ohm thin film resistors (not shown) to the puck bottom-surface ground plane. Thin film resistors are a very common thin-film fabrication technology and can be laser-trimmed for additional accuracy. A puck 210 for supporting the resistor-only version of the flip-chip is much simpler to fabricate than the puck 210 for the two-metal layer flip-chip fixture assembly 202. However, probing is not possible on the resistor-termination version and therefore only return loss measurements can be made from probe pad locations on the fixture 240. The resistor-termination version offers advantages in cost, fabrication time, and in cases where vector-network-analyzer (VNA) ports are limited. For example, a full set of s-parameters for a differential signal requires a four-port measurement. However, most VNAs only have two port test capabilities and extending the test ports from two to four requires additional expensive test equipment.

Alternatively, thin film resistors may be provided at the probe pads whereby the resistor values are approximately the same impedance as seen at the probe pads. In this way, resistors of approximately 50 ohms can be used for signals with 50 ohm characteristic impedance. Also, lower impedance power planes may be terminated with thin film resistors of approximately a few ohms. The measurements are taken as before but the effect of the thin film resistors are mathematically removed. Therefore, the resistors need not be laser trimmed for accuracy but instead need to be accurately measured to ensure accuracy of the mathematically corrected measurements. The matching resistors at the unprobed ports dampen resonances of the test structures, which generally produce better conditioned measurements. And when the pads are probed the shunt resistances, when approximately matched to the impedance of the structure at that port, only provide about a 6 dB error, which can be easily corrected. This technique allows one to accurately measure multiple ports, whether they are insertion/return loss measurements for multiple signals, or crosstalk between multiple signals, or power to ground delivery impedances, or isolation measurements between various power delivery paths.

The use of thin film substrates enables the use of interfacing to both IC connections and interface structures such as solderballs 244 of the BGA 220. Moreover, the thin film technology enables the use of fine pitch microwave probes that offer higher bandwidth over probes with a wider pitch. With a controlled impedance design for the fixture 240 and minimum geometries for the puck 210, the final assembly enables very accurate measurements. Test fixtures 200, 202 in accordance with embodiments of the present invention are compatible with inexpensive manufacturing and assembly processes and do not require elaborate fixturing and/or probing techniques. While the pucks 210 and/or fixtures 240 are preferably produced using a thin-film process, the puck 210 and fixture 240 may be produced using manufacturing techniques other than thin-film processes including any process that can produce fine metal features and spaces and closely spaced vias. Moreover, as new package technologies emerge, pucks 210 and/or fixtures 240 may be adapted to such emerging package technologies to provide test capabilities for new interface structures.

Figure 3:
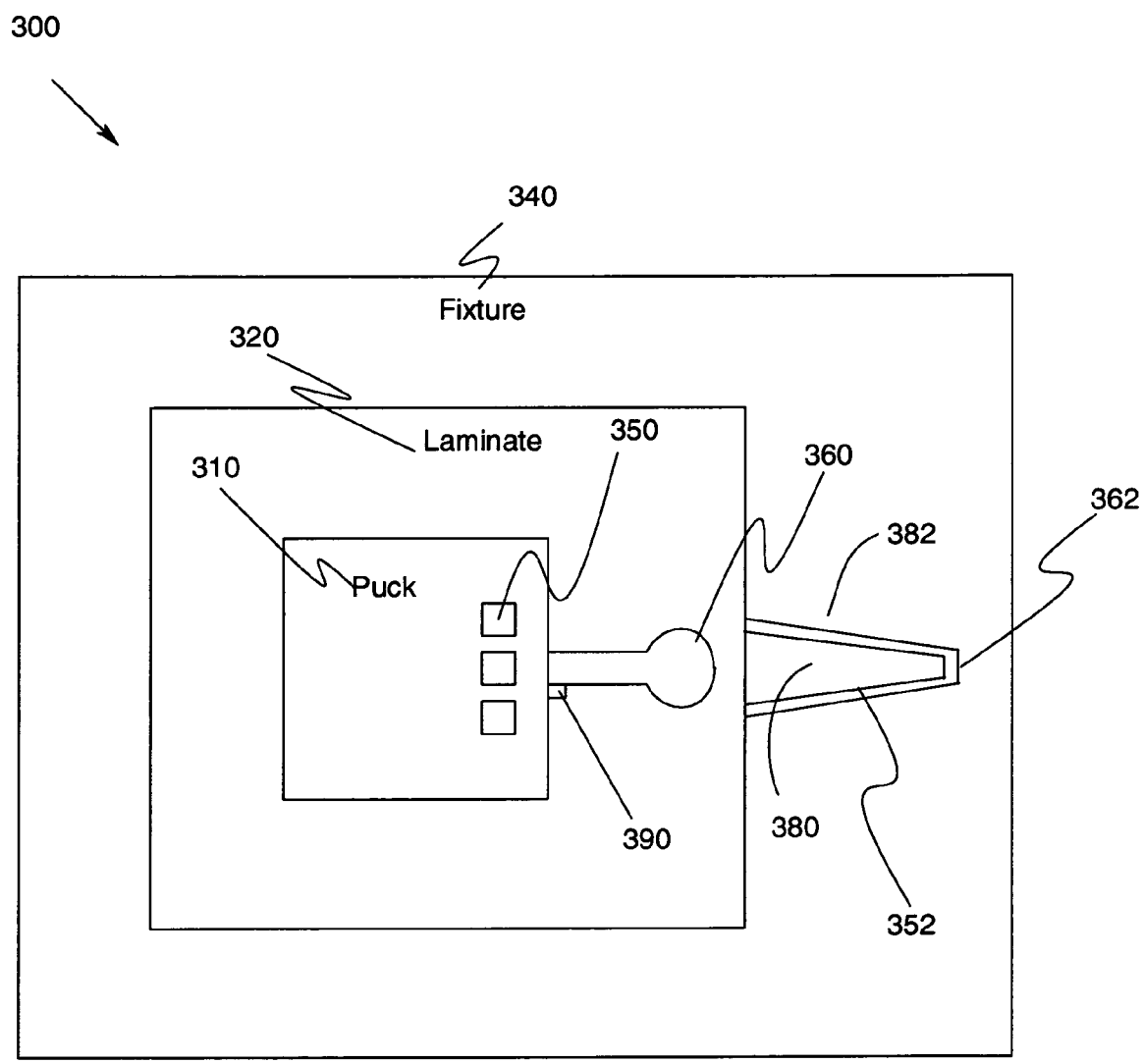
FIG. 3 is a top view of a fixture assembly for performing high frequency electronic package testing according to an embodiment of the present invention.

FIG. 3 is a top view of a fixture assembly 300 for performing high frequency electronic package testing according to an embodiment of the present invention. In FIG. 3, a puck 310 is attached to an organic (laminate) BGA 320. The BGA 320 is disposed onto the fixture board 340. Metal probe pads 350 on the puck provide routing to connect between the signal and ground pads to the signal/ground probe pad pattern. The metal lines 352 on fixture board 340 taper in width from the diameter of the solder ball pads 360 of the BGA 320 to the width required for fine-pitch microwave probes. The metal lines 352 are between solderball pads 360 and extend to fixture probe pads 362. The design for fixtures 340 according to embodiments of the present invention may utilize coplanar line designs that reduce fabrication costs of the fixture 340 as only one metal layer is required. Other designs for fixtures 340 according to embodiments of the present invention may use a two metal layer design with vias interconnecting top and bottom metal layers. While FIG. 3 shows tapered coplanar signals, other approaches are possible, such as microstrips. The coplanar signals are tapered from the larger dimensions of the pitch of the BGA solderballs 360, e.g., typically 1 mm, to the pitch of the fixture probe pads 362, e.g., typically from 50 to 150 microns. A tapered coplanar signal 380 to ground 382 gap may be used to provide a 50 ohm characteristic impedance so as to match that of the probes, cables, and VNA. As mentioned above, signal connections on the bottom of the puck 310 may be terminated with thin film resistors 390 to the puck bottom-surface ground plane. Similarly, thin film resistors may be applied to the fixture 340, which may enhance measurement accuracy, especially for power/ground impedance or isolation measurements (not shown in FIG. 3).

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A test fixture assembly, comprising:
   an electronic package having an interface structure;
   wherein the interface structure includes a ball grid array having solderballs on a first surface of the electronic package and solder pads on a second surface, the solder pads being coupled within the package to the solderballs;
   a mock-up integrated circuit (IC), coupled to the solder pads for providing circuit connections; and
   a fixture board, coupled to the solderballs of the ball grid array of the interface structure;
   wherein the fixture board and mock-up IC both include high frequency probe pads exposed for providing a signal and ground point for high bandwidth test probing; and
   wherein each probe pad on the fixture board is coupled to a solderball of the ball grid array and at least one of the probe pads on the fixture board is not covered by the ball grid array and is exposed on the fixture board for probing without coupling through the ball grid array.

2. The test fixture assembly of claim 1, wherein the mock-up IC emulates a flip-chip integrated circuit having a very thin substrate with metalization on the top and bottom on the mock-up IC that is interconnected with vias.

3. The test fixture assembly of claim 2, wherein the vias in the mock-up IC align with signal and ground solder bumps on the mock-up IC to bring signal and ground to the top surface of the mock-up IC, the vias being routed to redistribute the signals and grounds to match the probe patterns for fine-pitch microwave probes.

4. The test fixture assembly of claim 2, wherein the mock-up IC comprise a puck that comprises signal connections on the bottom, the signal connections being terminated with thin film resistors at a bottom-surface ground plane.

5. The test fixture assembly of claim 1 further comprising at least one resistor substantially equal to an impedance at the probe pads, the at least one resistor being disposed at the probe pads.

6. The test fixture assembly of claim 1, wherein the high frequency probe pads enable loss measurements from the fixture.

7. The test fixture assembly of claim 6, wherein the loss measurement comprises return loss when probe pads are disposed on one end and insertion loss when probe pads are disposed on an opposite end.

8. The test fixture assembly of claim 1, wherein the high frequency probe pads are configured to interconnect with fine pitch microwave probes.

9. The test fixture assembly of claim 1 further comprising a first set of metal lines formed on the mock-up IC to couple the probe pads of the mock-up IC to the solder pads of the electronic package.

10. The test fixture assembly of claim 9, wherein the fixture board includes a second set of metal lines tapering in width from the diameter of the solder balls of the ball grid array to a width required for fine-pitch microwave probes.

11. The test fixture assembly of claim 10, wherein the second set of metal lines comprise coplanar lines for reducing fabrication costs of the fixture.

12. The test fixture assembly of claim 9, wherein the first set of metal lines comprise a top and bottom metal layer with vias interconnecting top and bottom metal layers.

13. The test fixture assembly of claim 1, wherein the mock-up IC comprises a puck that is configured to emulate a wirebonded integrated circuit.

* * * * *